United States Patent
Gonohe et al.

(10) Patent No.: US 8,105,468 B2
(45) Date of Patent: Jan. 31, 2012

(54) METHOD FOR FORMING TANTALUM NITRIDE FILM

(75) Inventors: Narishi Gonohe, Shizuoka-ken (JP); Satoru Toyoda, Shizuoka-ken (JP); Harunori Ushikawa, Shizuoka-ken (JP); Tomoyasu Kondo, Shizuoka-ken (JP); Kyuzo Nakamura, Kanagawa-ken (JP)

(73) Assignee: Ulvac, Inc., Kanagawa (JP)

( * ) Notice: Subject to any disclaimer, the term of this patent is extended or adjusted under 35 U.S.C. 154(b) by 749 days.

(21) Appl. No.: 11/885,341

(22) PCT Filed: Mar. 3, 2006

(86) PCT No.: PCT/JP2006/304069
§ 371 (c)(1),
(2), (4) Date: Nov. 12, 2008

(87) PCT Pub. No.: WO2006/093259
PCT Pub. Date: Sep. 8, 2006

(65) Prior Publication Data
US 2010/0206716 A9 Aug. 19, 2010

(30) Foreign Application Priority Data
Mar. 3, 2005 (JP) ................................. 2005-059082

(51) Int. Cl.
*C23C 14/00* (2006.01)
*C23C 14/34* (2006.01)

(52) U.S. Cl. ......... 204/192.15; 204/192.1; 427/255.394; 438/680; 438/685

(58) Field of Classification Search ............... 204/192.1, 204/192.15; 427/255.394; 438/680, 685
See application file for complete search history.

(56) References Cited

U.S. PATENT DOCUMENTS

| | | | |
|---|---|---|---|
| 6,376,371 B1 | 4/2002 | Jain et al. | |
| 2004/0192021 A1 | 9/2004 | Li | |
| 2004/0219784 A1 * | 11/2004 | Kang et al. | .................. 438/653 |

FOREIGN PATENT DOCUMENTS

| | | |
|---|---|---|
| JP | 10-135155 A | 5/1998 |
| JP | 11-054459 | 2/1999 |
| JP | 2003-318174 | 11/2003 |
| JP | 2003-342732 A | 12/2003 |
| JP | 2004-006856 | 1/2004 |
| JP | 2005-203569 A | 7/2005 |
| KR | 2002-0010615 | 2/2002 |
| WO | WO 00/65125 A1 | 11/2000 |

OTHER PUBLICATIONS

Kwang-Nam Cho et al, "Remote Plasma-Assisted Metal Organic Chemical Vapor Deposition of Tantalum Nitride Thin Film with Different Radicals", Jpn.J.Appl.Phys., 1998 vol. 37, pp. 6502-6505.

Seoung Gon Park et al, "Stability of Plasma Posttreated TiN Films Prepared by Alternating Cyclic Pulses of Tetrakis-Dimethylamido-Titanium and Ammonia", Jpn.J.Appl.Phys., 2004, vol. 43, pp. 303-304.

Gladczuk, L. et al.; "Sputter deposition of bcc tantalum films with TaN underlayers for protection of steel", Thin Solid Films; vol. 476; pp. 295-302; Nov. 19, 2004.

* cited by examiner

*Primary Examiner* — Christopher Young
(74) *Attorney, Agent, or Firm* — Arent Fox, LLP

(57) ABSTRACT

A tantalum nitride film-forming method comprises the steps of introducing, into a vacuum chamber, a raw gas consisting of a coordination compound constituted by elemental Ta having a coordinated ligand represented by the general formula: $N=(R,R')$ (in the formula, R and R' may be the same or different and each represents an alkyl group having 1 to 6 carbon atoms) to thus adsorb the gas on a substrate; then introducing an $NH_3$ gas and then activated H radicals derived from a reactant gas into a vacuum chamber to thus remove the R(R') groups bonded to the nitrogen atom present in the reaction product through cleavage, and to thus form a tantalum nitride film rich in tantalum atoms. The resulting tantalum nitride film has a low resistance, low contents of C and N atoms, and a high compositional ratio: Ta/N, can ensure sufficiently high adherence to the distributing wire-forming film and can thus be useful as a barrier film. Moreover, tantalum particles are implanted in the resulting film according to the sputtering technique to thus further enrich the film with tantalum.

13 Claims, 7 Drawing Sheets

METHOD FOR FORMING TANTALUM NITRIDE FILM

CROSS-REFERENCE TO RELATED APPLICATION

This application is a National Stage entry of International Application No. PCT/JP2006/304069, filed Mar. 3, 2006, the entire specification claims and drawings of which are incorporated herewith by reference.

TECHNICAL FIELD

The present invention relates to a method for forming a tantalum nitride film and, in particular, to a method for forming, according to the ALD technique (Atomic Layer Deposition technique), a tantalum nitride film useful as a barrier film for distributing wire-forming films or electrical connection-forming films.

BACKGROUND ART

Recently, there has increasingly been desired for the development of a technique which permits the more finely processing step with respect to the thin film-forming technique used in the field of the semiconductor and this results in the occurrence of a variety of related problems.

In an example of the technique for forming electrical connections of a thin film in a semiconductor device, copper has mainly be used as a material for the electrical connection because of its low resistivity. However, it is technically difficult to etch copper and copper may easily penetrate or diffuse into the underlying layer such as an insulating film and accordingly, a problem arises such that the reliability of the resulting device is lowered.

To solve this problem, such diffusion of the copper has conventionally been prevented by forming a metal thin film (or a conductive barrier film) on the inner wall surface of the interlayer-connecting holes in a multi-layered electrical connection structure according to, for instance, the CVD technique; and then forming a layer for making the electrical connections by the application of a copper thin film on the conductive barrier film so that the resulting copper thin film never comes in direct contact with the underlying insulating film such as a silicon oxide film.

In this case, it has been required that fine contact holes, trenches or the like each having a high aspect ratio should be plugged or filled up with a thin barrier film while ensuring a high rate of step-coverage, with the foregoing demands for the use of electrical connections having a multi-layered structure and a further miniaturized pattern.

Under such circumstances, there has been proposed, for instance, a method for forming a barrier film having a desired thickness, according to the ALD technique which comprises the steps of raising the temperature of a substrate introduced into a vacuum chamber to a predetermined level; introducing one of a nitrogen atom-containing gas and a high-melting metal-containing gas into the chamber to thus make the same adsorb on the substrate; vacuum-evacuating the same gas; then introducing the other gas into the chamber to thus make them react with one another on the substrate; vacuum-evacuating the other gas introduced; and repeating the foregoing steps to thus form, on the substrate, a laminate of a plurality of metal nitride thin films each having a thickness roughly corresponding to one atom (hereunder referred to as "mono-atomic layer") (see, for instance, Japanese Un-Examined Patent Publication Hei 11-54459 (for instance, Claim 1)).

Moreover, there has also been known a method for forming a barrier layer, which comprises the step of depositing a layer of a material such as Ta, TiN or TaN using, for instance, the ALD technique (see, for instance, Japanese Un-Examined Patent Publication 2004-6856 (Claims and the like)).

The foregoing ALD technique is similar to the CVD technique in that it makes use of a chemical reaction between two or more kinds of precursors. However, these techniques differ from one another in that the usual CVD technique makes use of such a phenomenon that the different kinds of precursors in their gaseous states come in close contact with one another to thus make them chemically react with one another, while the ALD technique makes use of a surface reaction between the different kinds of precursors. More specifically, the ALD technique comprises the step of supplying a kind of precursor (for instance, a reactant gas) onto the surface of a substrate on which another kind of precursor (such as a raw gas) has been adsorbed in advance to bring these two kinds of precursors into contact with one another and make them react with one another on the surface of the substrate and to thus form a desired metal film. In this case, the reaction between the precursor initially adsorbed on the substrate surface and the precursor subsequently supplied onto the surface proceeds, on the substrate, at a quite high rate. The precursors usable herein may be in any state such as a solid, liquid or gaseous state and the raw gas is supplied while using a carrier gas such as $N_2$ or Ar. As has been discussed above, this ALD technique is a method for forming a mono-atomic thin film by repeating the step for adsorbing the raw gas on the substrate and the step for making the adsorbed raw gas react with the reactant gas alternatively. In other words, this technique can ensure an excellent rate of step coverage since the adsorption and further this technique the reaction always take place within the superficial dynamic region and permits the improvement of the density of the resulting film since the raw gas and the reactant gas are reacted with one another while separately introducing them into the reaction zone. For this reason, this technique has become of major interest lately.

The conventional mono-atomic layer-deposition apparatus (ALD apparatus) for forming a thin film according to the foregoing ALD technique consists of a film-forming apparatus provided with a vacuum evacuation means and the film-forming apparatus further comprises a substrate-mounting stage equipped with a heating means and a gas-introducing means arranged on the ceiling of the film-forming apparatus, which is opposed to the substrate-mounting stage. As an example of such an ALD apparatus, there has been known one having such a construction that a desired raw gas and a reactant gas are introduced into the apparatus through the gas-introducing means while setting a predetermined time lag between their introduction times to thus repeatedly carry out the raw gas-adsorption step and the reaction step in which the raw gas is reacted with the reactant gas by the aid of the plasma for the preparation of a thin film having a desired thickness (see, for instance, Japanese Un-Examined Patent Publication 2003-318174 (Claims and the like)).

DISCLOSURE OF THE INVENTION

Problems that the Invention is to Solve

In the case of the foregoing conventional technique, when using a gas consisting of a tantalum atom-containing organo-metal compound as the raw gas, the resulting tantalum nitride film has high contents of C and N atoms, while the compositional ratio of Ta to N: Ta/N is low. For this reason, a problem arises, such that it is difficult to form a tantalum nitride (TaN)

film having a low resistance and useful as a barrier layer, while ensuring the adherence to the Cu film used for forming electrical connections. To solve this problem, it would be necessary to develop a film-forming process which can break organic groups such as alkyl groups present in the raw gas used through the cleavage thereof to thus reduce the content of C and simultaneously break the linkages between Ta and N and to thus increase the compositional ratio: Ta/N.

Accordingly, it is an object of the present invention to solve the foregoing problems associated with the conventional techniques and more specifically to provide a method for forming a tantalum nitride film which has a low resistance, whose contents of C and N atoms are low, which has a high compositional ratio: Ta/N, which can ensure sufficiently high adherence to the electrical connection-forming film (such as Cu-electrical connection-forming film) and which is thus useful as a barrier film.

Means for Solving the Problems

The tantalum nitride film-forming method according to the present invention is characterized in that it comprises the steps of introducing a raw gas consisting of a coordination compound constituted by an elemental tantalum (Ta) having a coordinated ligand represented by the general formula: N=(R,R') (in the formula, R and R' may be the same or different and each represents an alkyl group having 1 to 6 carbon atoms), $NH_3$ gas or $NH_x$ radicals and H radicals derived from an H atom-containing gas into a vacuum chamber for the reaction of these components with one another on a substrate to thus remove the R(R') groups bonded to the N atoms present in the coordination compound through the cleavage thereof, to break, at the same time, Ta—N bonds present therein and to thus form a tantalum nitride film rich in tantalum atoms. In this connection, if the number of carbon atoms included in the foregoing coordination compound exceeds 6, a problem arises such that the carbon content of the resulting film increases.

The foregoing tantalum nitride film-forming method may likewise comprises the steps of introducing the raw gas, and $NH_3$ gas or $NH_x$ radicals into the vacuum chamber and reducing the raw compound on the substrate to thus form a surface adsorption film having a thickness corresponding to one or several atoms, which consists of the resulting reduced compound, and to partially remove the R(R') groups bonded to the N atoms present in the coordination compounds through the cleavage thereof; then breaking the Ta—N bonds present in the foregoing reduced compounds and breaking and removing the remaining R(R') groups bonded to the N atoms by the introduction of the H radicals derived from the H atom-containing gas into the vacuum chamber to thus form a tantalum nitride film rich in tantalum atoms. In this connection, it is also possible that the raw gas is first introduced into the vacuum chamber to thus adsorb the raw gas on the substrate, and then the $NH_3$ gas or $NH_x$ radicals are introduced into the vacuum chamber to thus make the same react with the adsorbed raw gas; or the raw gas and the $NH_3$ gas or $NH_x$ radicals are simultaneously introduced into the vacuum chamber to thus make them react with one another on the substrate and/or reduce the raw compound and to thus form a surface adsorption film consisting of the resulting reduction compound and having a thickness corresponding to one or several atoms. Moreover, the foregoing method for forming a tantalum nitride film may comprise the steps of first introducing the raw gas into the vacuum chamber to thus adsorb the raw gas on the substrate, and then introducing the H radicals derived from the H atom-containing gas into the vacuum chamber to thus make the H radicals react with the adsorbed raw gas; or first introducing the H radicals derived from the H atom-containing gas into the vacuum chamber to thus adsorb the radicals on the substrate, and then introducing the raw gas into the vacuum chamber to thus make the raw gas react with the adsorbed H radicals; and thereafter, introducing the $NH_3$ gas or $NH_x$ radicals into the vacuum chamber. Further, the foregoing method for forming a tantalum nitride film comprises the steps of first introducing the raw gas into the vacuum chamber to thus adsorb the raw gas on the substrate, and then simultaneously introducing the $NH_3$ gas or $NH_x$ radicals and the H radicals derived from the H atom-containing gas into the vacuum chamber to thus make them react with the adsorbed raw gas.

The method of the present invention comprising the foregoing steps would thus permit the formation of a tantalum nitride film whose contents of C and N atoms are reduced, whose Ta/N compositional ratio increases, which can ensure the satisfactory adherence to a Cu film and which is thus useful as a barrier layer for the Cu-electrical connections and which is rich in tantalum and has a low resistance.

The foregoing raw gas is desirably a gas of at least one coordination compound selected from the group consisting of penta-dimethylamino-tantalum (PDMAT), tert-amylimido-tris(dimethylamide) tantalum (TAIMATA), penta-diethylamino-tantalum (PEMAT), tert-butylimido-tris-(dimethylamide) tantalum (TBTDET), tert-butylimido-tris(ethylmethyl-amide) tantalum (TBTEMT), $Ta(N(CH_3)_2)_3 (NCH_2CH_3)_2$ (DEMAT) and $TaX_5$ (X represents a halogen atom selected from the group consisting of chlorine, bromine and iodine atoms).

The foregoing $NH_x$ radicals are desirably NH, $NH_2$, $NH_3$ radicals.

The foregoing hydrogen atom-containing gas is desirably at least one member or gas selected from the group consisting of $H_2$, $NH_3$ and $SiH_4$ gases.

The foregoing method for forming a tantalum nitride film would permit the preparation of a thin film rich in tantalum and having a low resistance, which satisfies the following requirement: the compositional ratio of tantalum to nitrogen present in the film: Ta/N≧2.0.

The method for forming a tantalum nitride film according to the present invention is characterized in that it comprises the steps of forming a tantalum nitride film according to the foregoing film-forming method; and then implanting tantalum particles into the resulting tantalum nitride film according to the sputtering technique which makes use of a target containing tantalum as the principal constituent component. This method would permit the formation of a tantalum nitride film further rich in tantalum and sufficiently satisfying the foregoing requirement: Ta/N≧2.0.

In this connection, it is also possible that after repeating the foregoing method for forming a tantalum nitride film over a plurality of times, tantalum particles are implanted into the resulting tantalum nitride film according to the sputtering technique which makes use of a target containing tantalum as the principal constituent component. Alternatively, the foregoing film-forming method and the foregoing step for the implantation of tantalum particles into the resulting tantalum nitride film according to the sputtering technique which makes use of a target containing tantalum as the principal constituent component are alternatively repeated over a plurality of times. The repetition of the sputtering step permits the improvement of the adhesiveness of the resulting barrier film and the removal of impurities such as carbon. According to another embodiment, it is also possible to carry out the step for implanting tantalum particles into the resulting tantalum nitride film according to the sputtering technique which makes use of a target containing tantalum as the principal constituent component, at any step (for instance, the adsorption step and/or the reaction step) during the implementation of the foregoing film-forming method.

The sputtering step is desirably carried out while controlling the DC power and the RF power of the sputtering apparatus in such a manner that the DC power is low, while the RF power is high.

Effects of the Invention

The present invention thus permits the formation of a tantalum nitride film having a low resistance, whose contents of C and N atoms are low, which has a high compositional ratio: Ta/N, which can ensure sufficiently high adherence to the electrical connection-forming film (such as Cu-electrical connection-forming film) and which is thus useful as a barrier film.

BEST MODE FOR CARRYING OUT THE INVENTION

According to the present invention, a low resistance tantalum nitride film having low contents of C and N atoms and a high compositional ratio: Ta/N can be prepared by making the raw gas consisting of the foregoing tantalum atom-containing coordination compound react with $NH_3$ gas in the vacuum chamber to thus form a reduced compound having Ta—N—$NH_x$ bonds on the substrate, and then making the reaction product react with H radicals derived from a gas of an H atom-containing compound.

Regarding the introduction of the foregoing raw gas, $NH_3$ gas or the like and H atom-containing gas into the vacuum chamber, each of the foregoing gases listed above may directly be introduced into the vacuum chamber by itself or it may likewise be introduced into the same along with an inert gas such as $N_2$ gas or Ar gas. With respect to the amounts of these reactants relative to that of the raw gas, the $NH_3$ gas is used in a flow rate of, for instance, about 100 to 1000 sccm per 5 sccm of the raw gas; and the H atom-containing gas is used in a flow rate of, for instance, 100 to 1000 sccm (as expressed in terms of the flow rate of $H_2$) per 5 sccm of the raw gas.

The temperature to be used in the foregoing two reactions is not restricted to any particular one inasmuch as it can cause a desired reaction. For instance, the reaction temperature is in general not more than 300° C. and preferably 150 to 300° C., for the reducing reaction between the raw gas and the $NH_3$ gas; and it is in general not more than 300° C. and preferably 150 to 300° C. for the reaction between H radicals and the reaction product of the foregoing reducing reaction. In this connection, if the adsorption of the raw gas on the substrate is carried out at a temperature of not more than 20° C., the amount of the raw gas adsorbed increases and as a result, the film-forming rate for the desired tantalum nitride film can be improved. In addition, it is desirable that the temporary pressure in the vacuum chamber ranges from 1 to 100 Pa for the initial reducing reaction and 1 to 100 Pa for the subsequent film-forming reaction.

As has been discussed above, the coordination compound is one constituted by an elemental tantalum (Ta) having a coordinated ligand represented by the general formula: N=(R,R') (in the formula, R and R' may be the same or different and each represents an alkyl group having 1 to 6 carbon atoms). The alkyl group may be, for instance, a linear or branched one such as a methyl, ethyl, propyl, butyl, pentyl or hexyl group. The coordination compound is in general one constituted by an elemental tantalum (Ta) having 4 or 5 coordinated ligands represented by the formula: N—(R,R').

It is also possible, in the foregoing method according to the present invention, that, for instance, after the adsorption of the raw gas on the substrate within the vacuum chamber, the adsorbed raw gas is reduced through the introduction of $NH_3$ gas into the chamber to thus form a reduced compound having Ta—N—$NH_x$ bonds, then H radicals derived from a hydrogen atom-containing gas are introduced into the chamber to form a tantalum nitride film and the foregoing steps are then repeated over desired times; that after the adsorption and reduction steps are repeated over desired times, then H radicals derived from a hydrogen atom-containing gas are introduced into the chamber to form a tantalum nitride film and thereafter these steps are repeated over desired times; that the raw gas and the $NH_3$ gas or $NH_x$ radicals are simultaneously introduced into the chamber to thus reduce the raw gas with the $NH_3$ gas or $NH_x$ radicals on the substrate, then the H radicals derived from an H atom-containing gas are introduced into the chamber to form a tantalum nitride film and then these steps are repeated over desired times; or that the raw gas is introduced into the chamber to thus adsorb the same on the substrate, then the $NH_3$ gas or $NH_x$ radicals and the H radicals are simultaneously introduced into the chamber and these steps are repeated over predetermined times to thus form a tantalum nitride film.

The method for preparing a tantalum nitride film according to the present invention can be carried out in any film-forming apparatus, inasmuch as it can be used for the practice of the so-called ALD method. For instance, such an apparatus may be a film-forming apparatus, for instance, that as shown in FIG. 1, in which a thin film can be formed on the surface of a substrate within a vacuum chamber and which is provided with a raw gas-introducing system for the introduction of a raw gas containing tantalum as a constituent element of the thin film, $NH_3$ gas or $NH_x$ radicals-introducing system for the introduction of $NH_3$ gas or $NH_x$ radicals, and a reactant gas-introducing system for the introduction of a reactant gas. Moreover, it is also possible to use a film-forming apparatus as shown in FIG. 4, which is a variation of the film-forming apparatus detailed above. The foregoing $NH_3$ gas and/or $NH_x$ radicals-introducing system is preferably equipped with a radical-generation device for forming the radicals of the reactive gas and the radicals may be generated according to either a so-called plasma-enhanced method or a catalytic method.

Incidentally, in the method for preparing a tantalum nitride film according to the present invention, it is necessary to carry out a known degassing treatment for the removal of impurities such as gases adhered to the surface of a substrate prior to the formation of such a barrier film, and an electrical connection-forming film of, for instance, Cu is finally formed after such a barrier film is formed onto the substrate. For this reason, if this film-forming apparatus is incorporated into a composite type electrical connection film-forming apparatus which is so designed that the film-forming apparatus is connected to at least the degassing chamber and an electrical connection film-forming chamber through a conveying chamber capable of being evacuated to a vacuum and that a transport robot can convey the substrate from the conveying chamber to the film-forming chamber, the degassing chamber and the electrical connection film-forming chamber, a series of steps extending from the pre-treatment step to the electrical connection film-forming step can be implemented in this apparatus.

Now, an embodiment of the method of the present invention will hereunder be described in detail with reference to the apparatus as shown in FIGS. 1 and 4 in line with the procedures depicted in the flow diagrams as shown in FIGS. 2 and 5.

In FIG. 1, a substrate holder 13 for mounting a substrate 12 is disposed below a vacuum chamber 11 of a film-forming apparatus 1. The substrate holder 13 comprises a stage 131 for mounting the substrate 12 and a heater 132 for heating the substrate 12 mounted on the stage.

Regarding the vacuum chamber 11, a raw gas-introducing system 14 is connected to an inlet opening (not shown) formed on the side wall of the vacuum chamber and an $NH_3$ gas or $NH_x$ radicals-introducing system 15 is connected to another inlet opening. Although, the gas-introducing systems 14 and 15 are schematically shown, in FIG. 1, in such a manner that they are vertically arranged on the same side of the vacuum chamber and connected thereto, but they are not limited in their connected portions on the side of the chamber at all and they may likewise be horizontally arranged on the side thereof inasmuch as they may permit the achievement of the desired or intended purposes. The raw gas is a gas of an organometal compound containing, in its chemical structure, a metallic constituent element (Ta) serving as a raw material for a barrier film to be formed or deposited on the substrate 12. The raw gas-introducing system 14 is composed of a gas bomb 141 filled with the raw gas, a gas valve 142 and a gas-introducing tube 143 connected to the raw gas-introducing opening through the valve and the system is so designed that the flow rate of the raw gas can be controlled with a mass-flow controller, which is not depicted on this figure. In addition, the $NH_3$ gas or $NH_x$ radicals-introducing system 15 is likewise composed of a gas bomb 151, a gas valve 152, a gas-introducing tube 153, a mass-flow controller (not shown) and radical generating means (not shown).

Regarding the raw gas-introducing system 14, a gas bomb filled with the raw gas may be used as has been discussed above, but the system may likewise be so designed that the foregoing organometal compound is accommodated in a container heated to and maintained at a predetermined temperature, an inert gas such as Ar gas serving as a bubbling gas is supplied to the container through, for instance, a mass-flow controller to thus sublimate the raw material, and the raw gas is thus introduced into the film-forming apparatus together with the bubbling gas; or a raw material may be vaporized through, for instance, a vaporizer and the resulting raw gas may then be introduced into the film-forming apparatus.

Moreover, to the vacuum chamber 11, there is connected a reactant gas-introducing system 16 through a reactant gas-introducing opening (not shown) formed on a position different from those of the introduction openings used for the introduction of the raw gas and the $NH_3$ gas or $NH_x$ radicals into the chamber. The reactant gas is a gas such as hydrogen gas or ammonium gas, which can react with the reaction product of the raw gas and the $NH_3$ gas or $NH_x$ radicals to thus make a metal thin film containing, in its chemical structure, tantalum (TaN) deposit on the substrate. This reactant gas-introducing system 16 is not limited in its connected portion on the chamber at all like the raw gas-introducing system 14 and the $NH_3$ gas or $NH_x$ radicals-introducing system 15, inasmuch as it may permit the achievement of the desired or intended purpose and it may, for instance, be connected to the chamber on the same side on which the gas-introducing systems 14 and 15 are arranged.

This reactant gas-introducing system 16 is composed of a gas bomb 161 filled with a reactant gas, a gas valve 162, a gas-introducing tube 163 connected to the reactant gas-introducing opening through the valve and a radical-generation device 164 positioned between the gas valve 162 and the reactant gas-introducing opening and the system is further connected to a mass-flow controller, which is not depicted on this figure. The gas valve 162 is opened to thus guide the reactant gas accommodated in the gas bomb 161 to the radical-generation device 164 through the gas-introducing tube 163 for the generation of radicals within the radical-generation device 164. The radicals thus generated are then introduced into the vacuum chamber 11.

Incidentally, with respect to the interrelation between the raw gas-introducing, $NH_3$ gas or $NH_x$ radicals-introducing and reactant gas-introducing openings, it is desirable that all of these gas-introducing openings are formed at positions in the proximity to the substrate holder 13 in order to make the raw gas and the $NH_3$ gas or $NH_x$ radicals react with one another on the surface of the substrate 12 and to likewise make the resulting reaction product and the reactant gas react with one another for the formation of a desired barrier film. Accordingly, as shown in FIG. 1, the gas-introducing openings for the raw gas, the $NH_3$ gas or $NH_x$ radicals and the reactant gas are desirably formed on the side of the vacuum chamber 11 and at a level slightly higher than the horizontal level of the surface of the substrate 12. In addition, the gas-introducing systems 14, 15 and 16 may be connected to the vacuum chamber in such a manner that each of the gases is fed to the substrate or the wafer from the upper part thereof.

In addition to the foregoing gas-introducing openings, the vacuum chamber 11 is further provided with an opening (not shown) for the connection thereof to a vacuum evacuation system 17 for the evacuation of the chamber. When evacuating the foregoing raw gas, the $NH_3$ gas or $NH_x$ radicals gas and the reactant gas from the vacuum evacuation system 17, it is preferred to form the opening for the evacuation at a position in the proximity to the substrate holder 13 in order to prevent the contamination of the wall surface of the vacuum chamber due to any flow of these gases towards the top plate of the chamber as low as possible and to evacuate the chamber to a vacuum as high as possible. Accordingly, as will be clear from FIG. 1, the opening for the evacuation is preferably formed on the bottom surface of the vacuum chamber 11.

The present invention will hereunder be described in line with the procedures depicted on the flow diagrams as shown in FIG. 2, which is herein given for explaining an embodiment of the process for forming a tantalum nitride film while making use of the film-forming apparatus as shown in FIG. 1.

After the completion of any pre-treatment of the surface of the substrate 12 such as a degassing treatment, the substrate 12 is introduced into the film-forming apparatus 1 which has been evacuated to a vacuum such as a known pressure level by the operation of the vacuum evacuation system 17 (S1). On the substrate, a known underlying adhesive layer may, if necessary, be formed on an insulating layer. For instance, the substrate may be one prepared by applying a voltage to a target while using the usual sputtering gas such as Ar gas to thus generate plasma, and then sputtering the target to thus form a metal thin film on the surface of the substrate, which may serve as an adherent layer on the side of the substrate.

After the introduction of the foregoing substrate 12 into the film-forming apparatus 1, which has been evacuated to a desired pressure, preferably a vacuum on the order of not more than $10^{-5}$ Pa (S1), the substrate is heated to a desired temperature of, for instance, not more than 300° C. using the heater 132 (S2). Thereafter, a purge gas consisting of an inert gas such as Ar or $N_2$ gas is introduced into the film-forming apparatus (S3-1), followed by the introduction, into the film-forming apparatus, of a raw gas (MO gas) consisting of a tantalum-containing organometal compound in the proximity to the surface of the substrate through the raw gas-introducing system 14 to thus adsorb the raw gas on the surface of the substrate (S3-2). Moreover, the gas valve 142 of the raw gas-introducing system 14 is closed to thus stop the introduction of the raw gas and the remaining raw gas is exhausted or discharged through the vacuum evacuation system 17 (S3-3).

Then the supply of the purge gas is stopped and the purge gas remaining in the chamber is exhausted (S3-4).

After the completion of the exhaustion of the raw gas remaining in the chamber, $NH_3$ gas or $NH_x$ radicals (such as $NH_3$ gas) are introduced into the film-forming apparatus 1 in a flow rate of, for instance, 100 to 1000 sccm through the $NH_3$ gas or $NH_x$ radicals-introducing system 15 (S3-5) to make the same react with the raw gas adsorbed on the substrate and to thus form a compound having Ta—N—$NH_x$ bonds (S3-6). In this case, if the flow rate of the $NH_3$ gas or $NH_x$ radicals exceeds 1000 sccm, the finally obtained barrier film never has a desired low resistance value. On the other hand, if the flow rate is less than 100 sccm, the resulting film has a high carbon content and accordingly the resistance value thereof is not sufficiently low. After the formation of the foregoing reduced compound, the gas valve 152 of the $NH_3$ gas or $NH_x$ radicals-introducing system 15 is closed to thus stop the supply of the gas or the radicals to the chamber and then the gas remaining in the chamber is evacuated through the vacuum evacuation system 17 (S3-7).

While continuing the foregoing vacuum evacuation, radicals of a reactant gas generated in the radical-generation device 164 are introduced into the film-forming apparatus 1 through the reactant gas-introducing system 16 (S3-8) to make the H radicals derived from the reactant gas react with the foregoing reaction product adsorbed on the surface of the substrate 12 for a predetermined period of time and to thus decompose the product (S3-9). Then the supply of the reactant gas is stopped by closing the gas valve 162 of the reactant gas-introducing system 16 and the reactant gas remaining in the film-forming apparatus is externally discharged through the vacuum evacuation system 17 (S3-10).

A quite thin metal film or a layer having a thickness of almost mono-atomic order, i.e., a barrier film is formed on the foregoing adhesive layer on the side of the substrate through the foregoing steps comprising a series of steps including the steps S3-1 to S3-10 (S4).

The foregoing steps S3-1 to S3-10 are repeated over predetermined times till the thickness of the barrier film reaches a desired level (S5) to thus form a tantalum nitride film serving as a barrier film having an intended resistance value.

The substrate, on which a tantalum nitride film having a desired thickness was formed, may, if necessary, further be treated by applying a voltage to a target while using a sputtering gas such as Ar gas to thus generate plasma and then sputtering the target according to the usual sputtering technique to thus form a metal thin film or an adhesive layer on the side of an electrical connection-forming film (an underlying layer on the side of the barrier film), on the surface of the foregoing tantalum nitride film (S6).

A laminated film is formed on the substrate 12 through the foregoing steps. Subsequently, the electrical connection-forming film is formed on the foregoing adhesive layer on the side of the electrical connection-forming film. The gas flow sequence on the basis of the flow diagram as shown in FIG. 2 is shown in FIG. 3.

FIG. 4 shows another film-forming apparatus used for the practice of the tantalum nitride film-forming method according to the present invention and this apparatus is so designed that it further comprises a sputtering target in addition to the components of the apparatus as shown in FIG. 1 so as to be able to simultaneously carry out a sputtering treatment. The same constituent elements used in the apparatus shown in FIG. 1 are represented by the same reference numerals and the detailed description thereof will accordingly be omitted herein.

Above the vacuum chamber 11, there is disposed a target 18 at the position opposite to the substrate holder 13. The target 18 is connected to a voltage-applying device 19 for generating plasma for sputtering the surface of the target with a sputtering gas and emitting particles of the target-constituting material. In this connection, the target 18 is composed of a material mainly comprising a metallic constituent element (Ta) included in the foregoing raw gas. The voltage-applying device 19 comprises a DC voltage-generation device 191 and an electrode 192 connected to the target 18. This voltage-applying device may be one which can superimpose DC and AC voltages. Moreover, the voltage-applying device may be one in which a high frequency-generation device is connected to the substrate holder and a bias voltage can thus be applied to the target.

Moreover, to the vacuum chamber 11, there is connected a sputtering gas-introducing system 20 through an opening (not shown) formed on the position different from those of the introduction openings used for the introduction of the raw gas, the $NH_3$ gas or $NH_x$ radicals and the reactant gas into the chamber. It is sufficient that the sputtering gas is any known inert gas such as argon gas and xenon gas. This sputtering gas-introducing system 20 is composed of a gas bomb 201 filled with such a sputtering gas, a gas valve 202, a gas-introducing tube 203 connected to the sputtering gas-introducing opening through this valve and a mass-flow controller (not shown).

Incidentally, with respect to the interrelation between the raw gas-introducing, $NH_3$ gas or $NH_x$ radicals-introducing and reactant gas-introducing openings, as has been discussed above, it is desirable that all of these gas-introducing openings are formed at positions in the proximity to the substrate holder 13 in order to form a desired barrier film through a desired reaction on the surface of the substrate 12. On the other hand, the foregoing sputtering gas-introducing opening is desirably formed at a position on the chamber in the proximity to the target 18 since the sputtering gas to be introduced into the chamber through the opening is used for the generation of the plasma thereof through the sputtering of the target.

Moreover, it is desirable that the gas-introducing openings for introducing the raw gas, the $NH_3$ gas or $NH_x$ radicals and the reactant gas be formed at positions on the chamber which are spaced apart from the target 18 in order to prevent any contamination of the target 18 due to the introduction of the raw gas, the $NH_3$ gas or $NH_x$ radicals and the reactant gas. Moreover, it is desirable that the opening for introducing the sputtering gas be formed at a position on the chamber which is spaced apart from the substrate holder 13, to inhibit any diffusion, towards the target 18, of the raw gas, the $NH_3$ gas or $NH_x$ radicals and the reactant gas, due to the action of the sputtering gas. Accordingly, as shown in FIG. 4, the gas-introducing openings for the raw gas, the $NH_3$ gas or $NH_x$ radicals and the reactant gas are desirably formed on the side of the vacuum chamber 11 and at a level slightly higher than the horizontal level of the surface of the substrate 12, while the opening for introducing the sputtering gas is desirably formed on the side of the vacuum chamber 11 and at a level slightly lower than the horizontal level of the surface of the target 18.

Furthermore, when evacuating the foregoing raw gas, the $NH_3$ gas or $NH_x$ radicals and the reactant gas from the vacuum evacuation system 17, it is preferred to form the opening for the evacuation in the proximity to the substrate holder 13 and at a position on the chamber which is spaced apart from the target 18, in order to prevent any contamination of the target 18 due to any flow of these gases towards the target 18. Accordingly, as will be clear from FIG. 4, the opening for the evacuation is preferably formed on the bottom surface of the vacuum chamber 11.

As has been described above in detail, the film-forming apparatus as shown in FIG. 4 permits the film-formation by the sputtering and the film-formation through the reaction of a raw gas, an $NH_3$ gas or $NH_x$ radicals and a reactant gas on a heated substrate within a single vacuum chamber 11.

FIG. 5 is a flow diagram for the illustration of an embodiment of the process for forming a laminated film using the film-forming apparatus as shown in FIG. 4. The flow diagram will hereunder be described in more detail with reference, in particular, to the points different from those shown in the flow diagram (FIG. 2).

After the completion of any pre-treatment of the surface of the substrate 12 such as a degassing treatment carried out according to any known method, the substrate 12 is introduced into the film-forming apparatus 1 which has been evacuated to a desired vacuum by the operation of the vacuum evacuation system 17 (S4).

After the introduction of the foregoing substrate 12 into the film-forming apparatus 1, it is, if necessary, also possible that a sputtering gas such as Ar gas is introduced into the chamber through the sputtering gas-introducing system 20 (S2) and a voltage is applied to the target 18 by the operation of the voltage-applying device 19 to thus generate plasma (S3) for the sputtering of the target 18 with the plasma particles to thus form a metal thin film or an adhesive layer on the side of the substrate (an underlying layer on the side of the substrate) on the surface of the substrate 12 (S4).

After the completion of the step S4, the substrate 12 is heated to a desired temperature with a heater 132 (S5), followed by the steps S6-1 to S6-10 in the same manner used above in the steps S3-1 to S3-10 as shown in FIG. 2, to thus form a very thin metal film almost identical to a mono-atomic layer or a tantalum nitride film serving as a barrier film on the adhesive layer on the side of the substrate (S7). The foregoing steps S6-1 to S6-10 are repeated over desired times till the thickness of the resulting barrier film reaches a desired level (S8). The gas flow sequence on the basis of the flow diagram as shown in FIG. 5 is similar to that described above in connection with FIG. 3.

Although there is not shown in the flow diagram depicted on FIG. 5, the foregoing steps S6-1 to S6-10 and the introduction of a sputtering gas through the sputtering gas-introducing system 20 may alternatively be repeated over a plurality of times till the resulting film has a desired thickness, upon the formation of the foregoing barrier film in order to improve the adherence of the barrier film and to remove any impurities.

Then, after the completion of the foregoing steps S6-1 to S6-10 or during the practice of these steps, an inert gas such as Ar gas is introduced while inducing discharges to thus sputter the target 18 mainly comprising tantalum as a constituent component of the raw gas and to implant tantalum particles as the sputtering particles in the thin film formed on the substrate 12. Thus, tantalum originated from the target 18 can be implanted into the substrate 12 according to the sputtering technique and therefore, the content of tantalum in the barrier film can further be increased to thus give a tantalum nitride film rich in tantalum and having a desired low resistance value. In this respect, as the raw gas is an organic tantalum compound, the decomposition thereof is accelerated and impurities such as C and N are expelled when the constituent element (tantalum) is incident upon the surface of the substrate 12 according to the foregoing sputtering and as a result, this results in the formation of a low resistant barrier film having a quite low content of impurities.

This sputtering operation is not carried out for the formation of a laminated tantalum film, but for the implantation of tantalum particles in the tantalum nitride film through the bombardment to remove C and N through sputtering and to improve the quality of the film. Accordingly, it is needed that this sputtering must be performed under such conditions that any tantalum film is not formed, or which permit the etching of the film with tantalum particles. To this end, it would, for instance, be necessary that the sputtering step is carried out while controlling the DC power and the RF power in such a manner that the DC power is low and the RF power is high. For instance, such sputtering conditions which are never accompanied by the formation of any tantalum film can be established when the DC power is set at a level of not more than 5 kW, while the RF power is set at a high level, for instance, ranging from 400 to 800 W. In this connection, the RF power is dependent upon the DC power and therefore, these DC and RF powers are appropriately adjusted so as to control the extent of the improvement of the film quality. In addition, the sputtering temperature may be one usually adopted and it may, for instance, be one identical to that used for the formation of the tantalum nitride film.

After the formation of such a barrier film having a desired thickness on the foregoing substrate according to the foregoing procedures, it is, if necessary, also possible that a sputtering gas such as Ar gas is introduced into the chamber through the sputtering gas-introducing system 20 (S9) and a voltage is applied to the target 18 by the operation of the voltage-applying device 19 to thus generate plasma (S10) for the sputtering of the target 18 according to any known sputtering technique to thus form a metal thin film or an adhesive layer on the side of the electrical connection-forming film (an underlying layer on the side of the barrier film) on the surface of the foregoing barrier film (S11).

A laminated film is thus formed on the substrate 12 through the foregoing steps. Subsequently, the electrical connection-forming film is formed on the foregoing adhesive layer on the side of the electrical connection-forming film.

In this respect, as has been described above, it is desirable for the prevention of any contamination of the target that the raw gas, the $NH_3$ gas or $NH_x$ radicals and the reactant gas are introduced into the reaction chamber, in the foregoing steps, at positions on the chamber which are spaced apart from the target 18. Moreover, it is also desirable that the sputtering gas is introduced into the reaction chamber at a position on the chamber which is spaced apart from the substrate holder 13, to inhibit any diffusion, towards the target 18, of the raw gas, the $NH_3$ gas or $NH_x$ radicals and the reactant gas, due to the action of the sputtering gas.

Furthermore, when evacuating the foregoing raw gas, the $NH_3$ gas or $NH_x$ radicals and the reactant gas through the vacuum evacuation system 17, it is preferred to carry out the evacuation at a position on the chamber which is in the proximity to the substrate holder 13 and which is spaced apart from the target 18, in order to prevent any contamination of the target 18 due to any flow of these gases towards the target 18.

FIG. 6 is a schematic diagram showing the structure of a composite type electrical connection film-forming apparatus equipped with the film-forming apparatus 1 shown in FIG. 1 or 4.

This composite type electrical connection film-forming apparatus 100 is composed of a pre-treatment section 101, a film-forming section 103 and a relay section 102 connecting these sections 101 and 103. Either of these sections should be maintained under desired vacuum atmospheric conditions prior to the implementation of each treatment.

First of all, in the pre-treatment section 101, a substrate free of any treatment and arranged in a transfer chamber 101a is introduced into a degassing chamber 101c by operating a conveyer robot 101b for the pre-treatment section. The untreated substrate is heated in the degassing chamber 101c to thus subject the substrate to a degassing treatment by, for instance, the evaporation of the moisture present on the surface thereof. Then the degassed substrate is transferred to a reduction-treating chamber 101d by the action of the conveyer robot 101b. In this reduction-treating chamber 101d, the substrate is subjected to an annealing treatment in which the substrate is heated while supplying a reducing gas such as hydrogen gas to the chamber to thus remove metal oxides of the underlying electrical connections through the reduction.

After the completion of the annealing treatment, the substrate is withdrawn from the reduction-treating chamber 101d and then transferred to the relay section 102 by the action of the conveyer robot 101b. The substrate is then delivered to a conveyer robot 103a for the film-forming section 103 in the relay section 102.

The substrate thus delivered to the conveyer robot 103a is then introduced into a film-forming chamber 103b by the action of the robot 103a. This film-forming chamber 103b corresponds to the film-forming apparatus 1 described above. In the film-forming chamber 103b, a barrier film and an adhesive layer are formed on the substrate as a laminate film, the substrate provided thereon with the laminate film is then withdrawn from the film-forming chamber 103b and introduced into an electrical connection film-forming chamber 103c, in which an electrical connection-forming film is applied onto the foregoing barrier film (or onto the adhesive layer, if an adhesive layer is formed on the barrier film). After the formation of the electrical connection-forming film, the substrate is transferred from the electrical connection film-forming chamber 103c to a transfer chamber 103d by putting the conveyer robot 103a into operation.

As has been discussed above in detail, the working efficiency can be improved by the use of an apparatus such as the foregoing composite type electrical connection film-forming apparatus 100, in which a series of steps including the barrier film-forming step and those carried out before and after the former, or the degassing step and the electrical connection film-forming steps can be carried out in such a single or the same apparatus.

In this connection, the foregoing composite type electrical connection film-forming apparatus 100 is so designed that the pre-treatment section 101 comprises one each of the degassing chamber 101c and the reduction chamber 101d, while the film-forming section 103 comprises one each of the film-forming chamber 103b and the electrical connection film-forming chamber 103c, but the construction of the apparatus 100 is not restricted to this structure.

Accordingly, for instance, the pre-treatment section 101 and the film-forming section 103 may be so designed that each of them has a polygonal shape, and that a plurality of degassing chambers 101c and reduction chambers 101, or a plurality of film-forming chambers 103b and electrical connection film-forming chambers 103c are arranged on each face, respectively, and this would result in the further improvement of the throughput capacity of the apparatus.

EXAMPLE 1

In this Example, a tantalum nitride film was prepared according to the procedures shown in the flow diagram depicted in FIG. 2, using the film-forming apparatus 1 shown in FIG. 1, and using penta-dimethylamino-tantalum (MO) gas as the raw gas, $NH_3$ gas as the $NH_3$ gas or $NH_3$ radicals and H radicals derived from a reactant gas.

After the surface of a substrate 12 provided thereon with an $SiO_2$ insulating film was subjected to a pre-treatment or a degassing treatment according to a known method, the substrate was introduced into the film-forming apparatus 1 which had been vacuum-evacuated to a pressure of not more than $10^{-5}$ Pa by putting the vacuum evacuation system 17 into operation (S1). The substrate used herein is not limited to any particular one, and it may be, for instance, one prepared by applying a voltage to a target, which comprises Ta as a principal constituent, while using Ar gas as a sputtering gas, to thus generate plasma for the sputtering of the target according to the usual sputtering technique to thus form an adhesive layer on the side of the substrate.

After the introduction of the substrate 12 into the film-forming apparatus 1, the substrate 12 was heated to a temperature of 250° C. with the heater 132 (S2). Subsequently, an Ar purge gas was introduced into the apparatus and then the foregoing raw gas was supplied thereto in the proximity to the surface of the substrate, at a flow rate of 5 sccm for 5 seconds through the raw gas-introducing system 14 (S3-1, S3-2). After adsorbing the raw gas on the surface of the substrate 12, the gas valve 142 of the raw gas-introducing system 14 was closed to thus stop the supply of the raw gas and then the raw gas remaining in the apparatus was removed by the evacuation of the apparatus 1 for 2 seconds through the vacuum evacuation system 17 (S3-3).

Then the supply of the Ar purge gas was stopped and then the purge gas remaining in the apparatus was removed by the vacuum evacuation (S3-4).

With the continuation of this vacuum evacuation, the $NH_3$ gas was introduced into the film-forming apparatus 1 through the $NH_3$ gas or $NH_x$ radicals-introducing system 15 at a flow rate of 200 sccm for 5 seconds (S3-5) to make the $NH_3$ gas react with the raw gas (MO gas) adsorbed on the substrate and to thus form a reduced compound having Ta—N—NH, bonds (S3-6). Then the supply of the $NH_3$ gas or $NH_x$ radicals was interrupted and the vacuum chamber was subjected to vacuum evacuation (S3-7).

With the continuation of the foregoing vacuum evacuation, $H_2$ gas was passed through the radical-generation device 164 through the reactant gas-introducing system 16 to thus generate hydrogen radicals, the resulting radicals were guided to the film-forming apparatus 1 (S3-8) to thus make the radicals react with the reaction product of the foregoing raw gas and the $NH_3$ gas or $NH_x$ radicals present on the surface of the substrate 12 for a predetermined period of time for the decomposition of the product (S3-9).

After the completion of the foregoing reaction, the gas valve 162 of the reactant gas-introducing system 16 was closed to thus stop the supply of the reactant gas and then the reactant gas remaining in the apparatus was removed by the evacuation of the apparatus 1 for 2 seconds through the vacuum evacuation system 17 (S3-10).

A quite thin metal film or a layer having a thickness of almost mono-atomic order, i.e., a barrier film consisting of a tantalum nitride film rich in tantalum was formed on the foregoing adhesive layer on the side of the substrate through the foregoing steps comprising a series of steps including the steps S3-1 to S3-10 (S4).

The foregoing steps S3-1 to S3-10 were repeated over predetermined times till the thickness of the barrier film reached a desired level (S5). The barrier film thus formed was inspected for the composition thereof and it was found that the ratio: Ta/N was 2.1 and the content of C was not more than 1% and that of N was 33%.

By way of comparison, the same procedures used in the foregoing method were repeated except for using a combination of the foregoing raw gas (MO gas) and the $NH_3$ gas; and using a combination of the foregoing raw gas (MO gas) and the H radicals, to thus form comparative films.

The specific resistance (resistivity) $\rho$ ($\mu\Omega\cdot cm$) was calculated for each of the thin films prepared above and the results are plotted on FIG. 7. More specifically, the resistivity was obtained by measuring the sheet resistance (Rs) according to the four point probe method and determining the film thickness (T) by the SEM, followed by the substitution of these data in the following relation: $\rho=Rs\cdot T$.

As will be clear from the data plotted on FIG. 7, the film prepared by reacting (reduction) the raw gas (MO gas) with the $NH_3$ gas and then supplying the reactant gas (H radicals) was found to have a resistivity value (430 $\mu\Omega\cdot cm$) significantly lower than those observed for the films prepared using a combination of MO gas and $NH_3$ gas (several tens of thousands of $\mu\Omega\cdot cm$) and a combination of MO gas and $NH_x$ radicals (twenty and several thousands of $\mu\Omega\cdot cm$) and a combination of MO gas and H radicals (8,000 $\mu\Omega\cdot cm$).

The foregoing results would clearly indicate that the formation of a film through the reaction of MO gas with $NH_3$ gas or $NH_x$ radicals or H radicals never permits any sufficient removal of R (alkyl groups) or the removal of C and thus the resulting film does not have a satisfactorily reduced resistivity.

On the other hand, the foregoing results would likewise clearly indicate that, when forming a tantalum nitride film with the use of the MO gas, $NH_3$ gas and H radicals, the use of the $NH_3$ gas or $NH_x$ radicals or the H radicals would permit the sufficient removal of such groups R (alkyl groups) and the sufficient reduction of the contents of C and N atoms in the resulting tantalum nitride film, make the Ta content in the resulting nitride film more rich and result in the sufficient reduction of the resistivity thereof.

As has been described above, the substrate which has been provided thereon with a tantalum nitride film having a desired thickness may, if necessary, further be treated by applying a voltage to a target, while using Ar gas as a sputtering gas, to thus generate plasma for the sputtering of the target according to the usual sputtering technique to thus form a metal thin film or an adhesive layer on the side of an electrical connection-forming film serving as an underlying layer on the surface of the barrier film (S6).

A Cu-electrical connection-forming film was applied, under the known process conditions, onto the substrate 12 provided thereon with the laminated film thus formed or on the adhesive layer on the side of the barrier film, if such an adhesive layer had been formed on the substrate. In this respect, it was confirmed that the adhesiveness between each neighboring films was excellent.

EXAMPLE 2

In this Example, a tantalum nitride film was prepared according to the procedures shown in the flow diagram depicted in FIG. 5, using the film-forming apparatus 1 shown in FIG. 4, and using penta-dimethylamino-tantalum (MO) gas as the raw gas, $NH_3$ gas, and the gas which generate H radicals as the reactant gas.

A substrate 12, whose surface had been subjected to a pre-treatment or a degassing step according to the method used in Example 1, was introduced into the film-forming apparatus 1 which had been vacuum-evacuated to a pressure of not more than $10^{-5}$ Pa by putting the vacuum evacuation system 17 into operation (S1).

After the introduction of the substrate 12, the substrate may, if necessary, be processed by introducing Ar gas as a sputtering gas through the sputtering gas-introducing system 20 (S2), while applying a voltage to a Ta-containing target 18 through the voltage-applying device 19, to thus generate plasma (S3) for the sputtering of the target to thus form, on the surface of the substrate 12, a metal thin film or an adhesive layer on the side of the substrate (S4).

After the completion of the step S4, the substrate 12 was heated to a temperature of 250° C. with the heater 132 (S5). Subsequently, an Ar purge gas was introduced into the apparatus and then the foregoing raw gas was supplied thereto at the position in the proximity to the surface of the substrate, at a flow rate of 5 sccm for 5 seconds through the raw gas-introducing system 14.

A series of the steps S6-1 to S6-10 as shown in FIG. 5 were carried out by the same procedures used in the steps S3-1 to S3-10 described in Example 1 to deposit a quite thin metal film having a size of almost mono-atomic order on the foregoing adhesive layer on the side of the substrate and to thus form a barrier film consisting of a tantalum nitride film rich in tantalum (S7).

The foregoing steps S6-1 to S6-10 were repeated over desired times till the thickness of the barrier film reached a predetermined level (S8). The tantalum nitride film thus formed was inspected for various properties thereof and it was found that the ratio: Ta/N, the contents of C and N as well as the specific resistance of the resulting thin film were identical to those observed for the thin film prepared in Example 1.

Incidentally, the foregoing steps S6-1 to S6-10 and the introduction of a sputtering gas through the sputtering gas-introducing system 20 may alternatively be repeated over a plurality of times till the resulting film has a desired thickness, upon the formation of the foregoing barrier film, in order to improve the adherence of the barrier film and to remove any impurities.

Then, after the completion of the foregoing steps S6-1 to S6-10 or during the practice of these steps, an inert gas such as Ar gas is introduced while inducing discharges to thus sputter the target 18 comprising tantalum as the main constituent thereof and to implant tantalum particles as the sputtering particles in the thin film formed on the substrate 12. In this respect, the sputtering step was conducted under the following conditions: DC power: 5 kW; RF power: 600 W; and the step was carried out at a sputtering temperature of 250° C.

Thus, the implantation of the tantalum-containing particles into the thin film permitted a further increase in the content of tantalum in the barrier film to thus give a tantalum nitride film rich in tantalum and having a desired low resistance value. In this respect, the decomposition of the raw gas was accelerated and impurities such as C and N were expelled from the barrier film by the impact of such tantalum particles on the substrate 12 and as a result, this resulted in the formation of a low resistant barrier film having a quite low content of impurities. The thin film thus formed was inspected for a variety of properties thereof and it was found that the ratio: Ta/N was 3.5 and the content of C was not more than 0.1% and that of N was 22%. In addition, the resulting thin film had a specific resistance value of 90 $\mu\Omega\cdot cm$.

After the formation of such a modified tantalum nitride film having a desired thickness according to the foregoing procedures, it is, if necessary, also possible that a sputtering gas such as Ar gas is introduced into the chamber through the sputtering gas-introducing system 20 (S9) and a voltage is applied to the target 18 by the operation of the voltage-applying device 19 to thus generate plasma (S10) and then the target 18 is sputtered according to any known sputtering technique to thus form a metal thin film or an adhesive layer on the side of the electrical connection-forming film as an underlying layer on the surface of the barrier film (S11).

A Cu-electrical connection-forming film was formed, under the known process conditions, onto the substrate 12 provided thereon with the laminated film thus formed according to the foregoing steps or on the adhesive layer on the side of the electrical connection-forming film, if such an adhesive layer had been formed on the substrate. In this respect, it was confirmed that the adhesiveness between each neighboring films was excellent.

In this respect, as has been described above, it is desirable for the prevention of any contamination of the target that the raw gas, $NH_3$ gas or $NH_x$ radicals and the reactant gas are introduced into the reaction chamber, in the foregoing steps, at positions on the chamber which are spaced apart from the target 18. Moreover, it is also desirable that the sputtering gas is introduced into the reaction chamber at a position on the chamber which is spaced apart from the substrate holder 13, to inhibit any diffusion, towards the target 18, of the foregoing gases, due to the action of the sputtering gas.

Furthermore, when evacuating the foregoing raw gas, $NH_3$ gas or $NH_x$ radicals and the reactant gas through the vacuum evacuation system 17, it is preferred to carry out the evacuation at a position on the chamber which is in the proximity to the substrate holder 13 and which is spaced apart from the target, in order to prevent any contamination of the target 18 due to any flow of these gases towards the target 18.

EXAMPLE 3

The same film-forming procedures used in Example 1 were repeated except that tert-amylimido-tris(dimethylamino) tantalum was substituted for the penta-dimethylamino-tantalum used in Example 1 to thus form a low-resistant tantalum nitride film rich in tantalum. The resulting film was inspected for a variety of properties thereof and it was found that the ratio: Ta/N was 1.95 and the content of C was 1% and that of N was 34%. In addition, the resulting thin film had a specific resistance value of 400 $\mu\Omega \cdot cm$.

INDUSTRIAL APPLICABILITY

The present invention permits the formation of a tantalum nitride film which has a low resistance value, whose contents of C and N atoms are low, which has a high compositional ratio: Ta/N, which can ensure sufficiently high adherence to a Cu film) and which is thus useful as a barrier film. Accordingly, the present invention can be applied to the thin film-forming process in the field of the semiconductor device.

DESCRIPTION OF SYMBOLS

Figure 1:
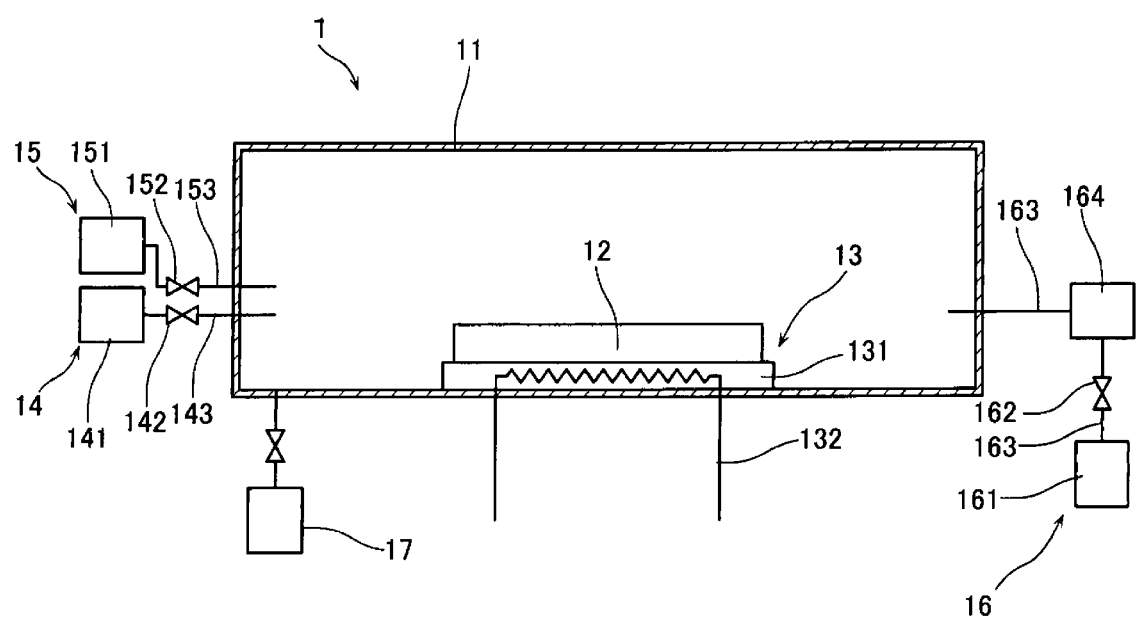
FIG. 1 is a schematic block diagram for illustrating an embodiment of a film-forming apparatus used for practicing the film-forming method according to the present invention.
Figure 2:
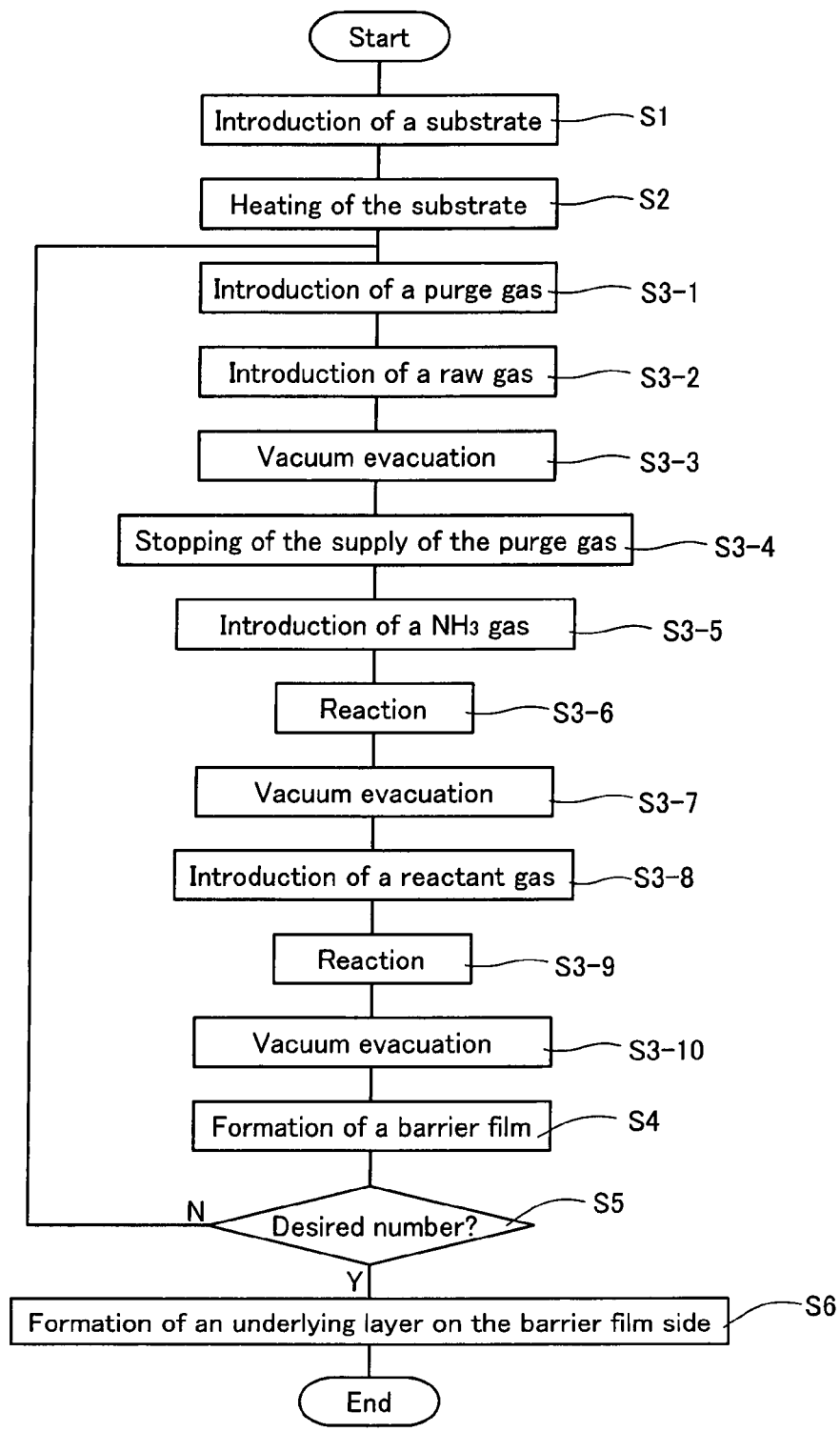
FIG. 2 is a flow diagram for explaining the process for forming a thin film using the apparatus as shown in FIG. 1.
Figure 3:
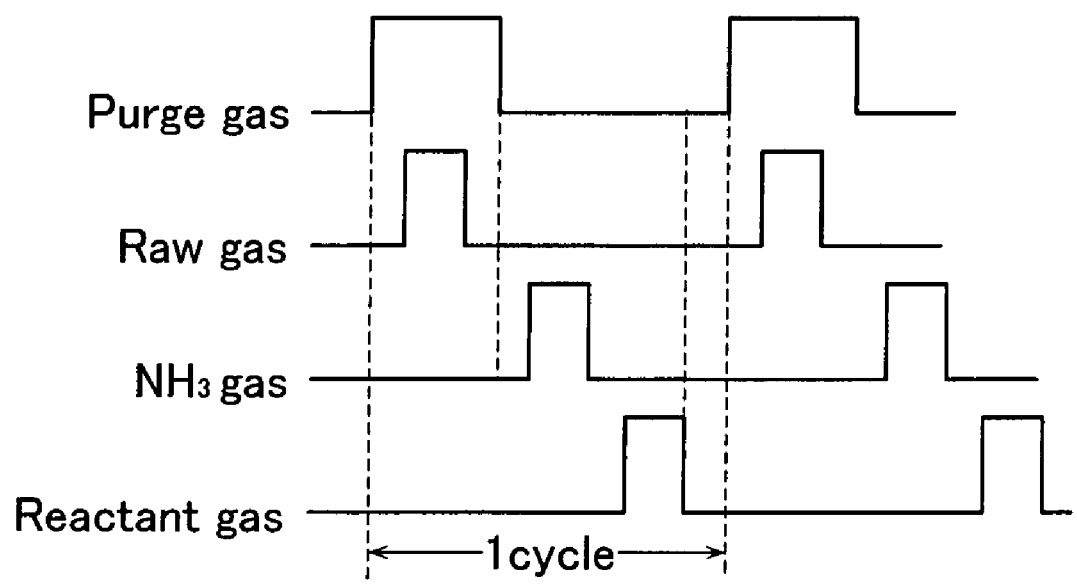
FIG. 3 is a diagram showing the gas flow sequence on the basis of the flow diagram as shown in FIG. 2.
Figure 4:
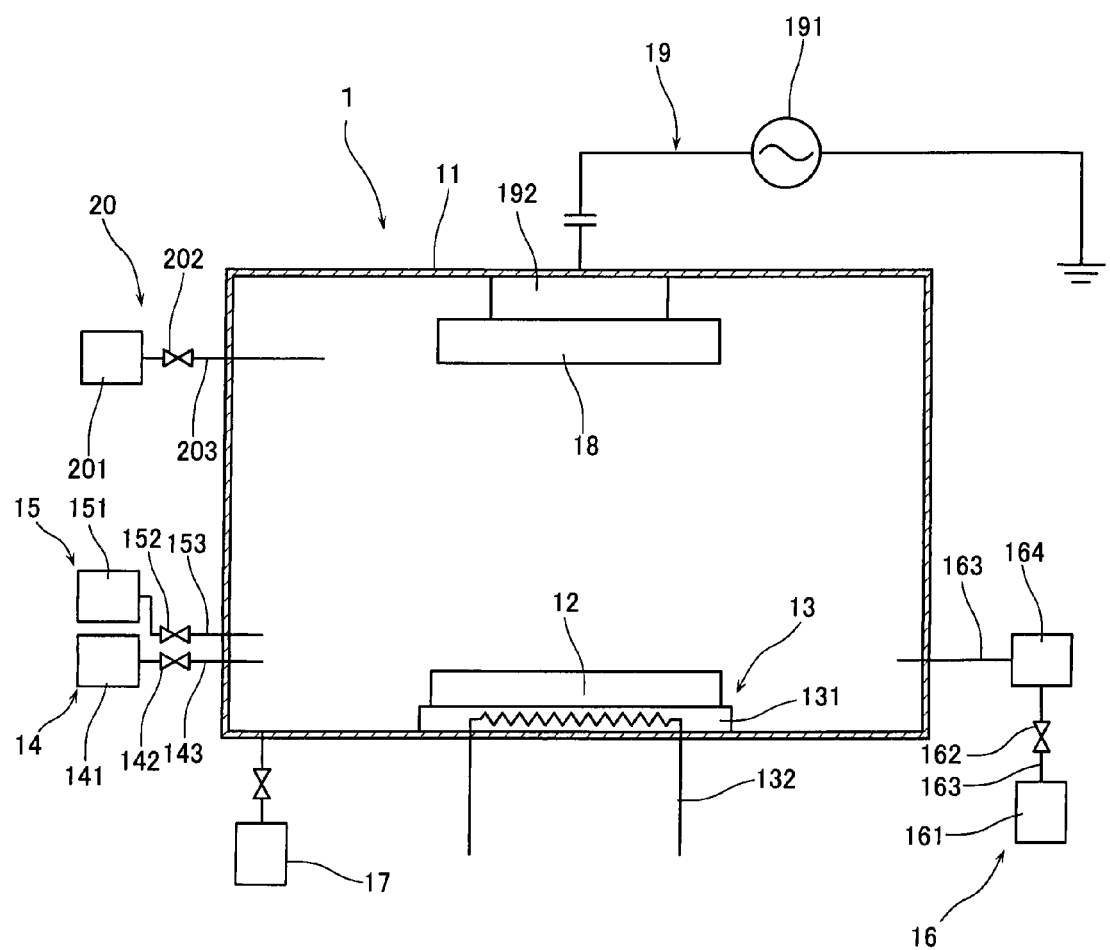
FIG. 4 is a schematic block diagram for illustrating another embodiment of a film-forming apparatus used for practicing the film-forming method according to the present invention.
Figure 5:
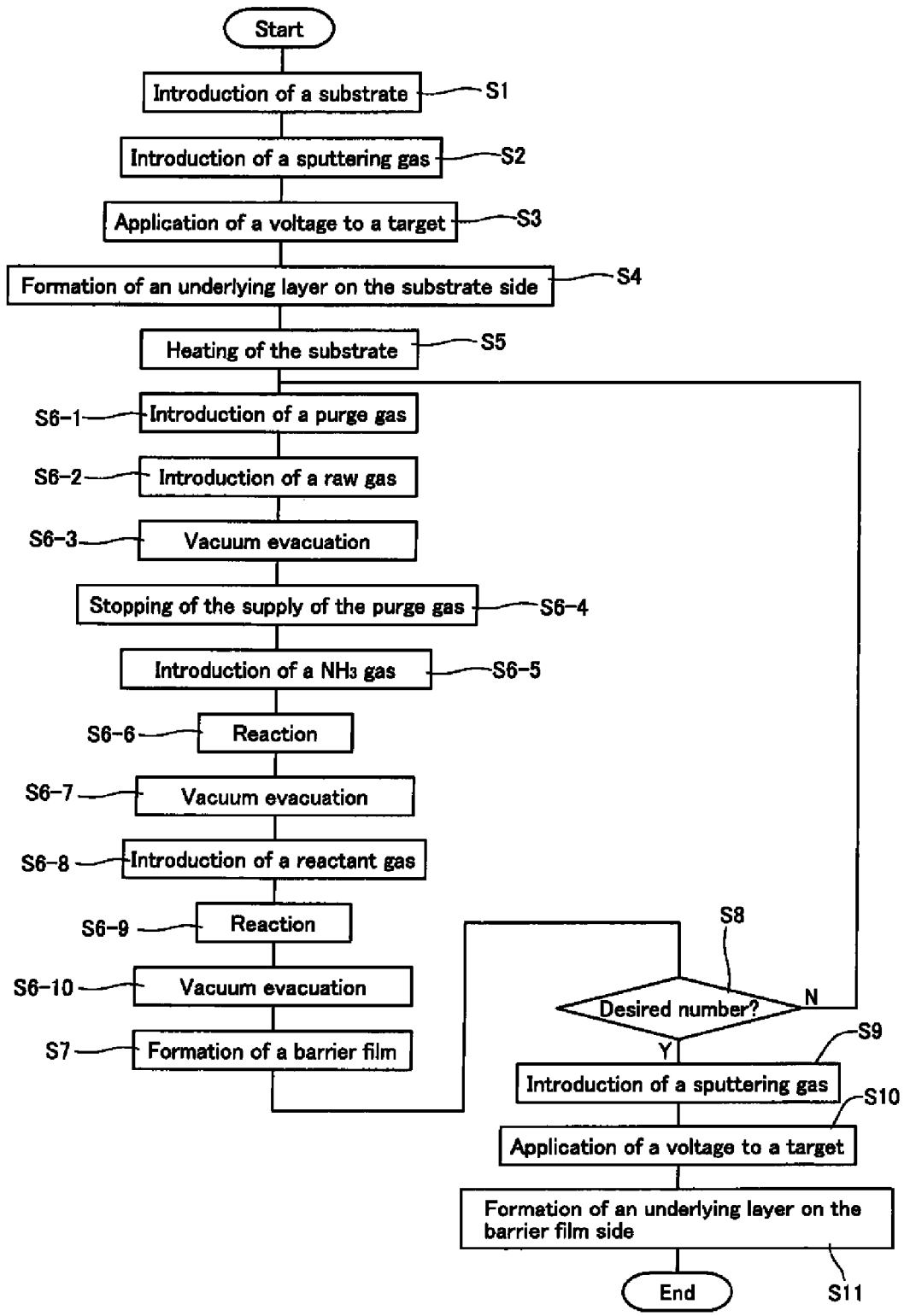
FIG. 5 is a flow diagram for explaining the process for forming a thin film using the apparatus as shown in FIG. 4.
Figure 6:
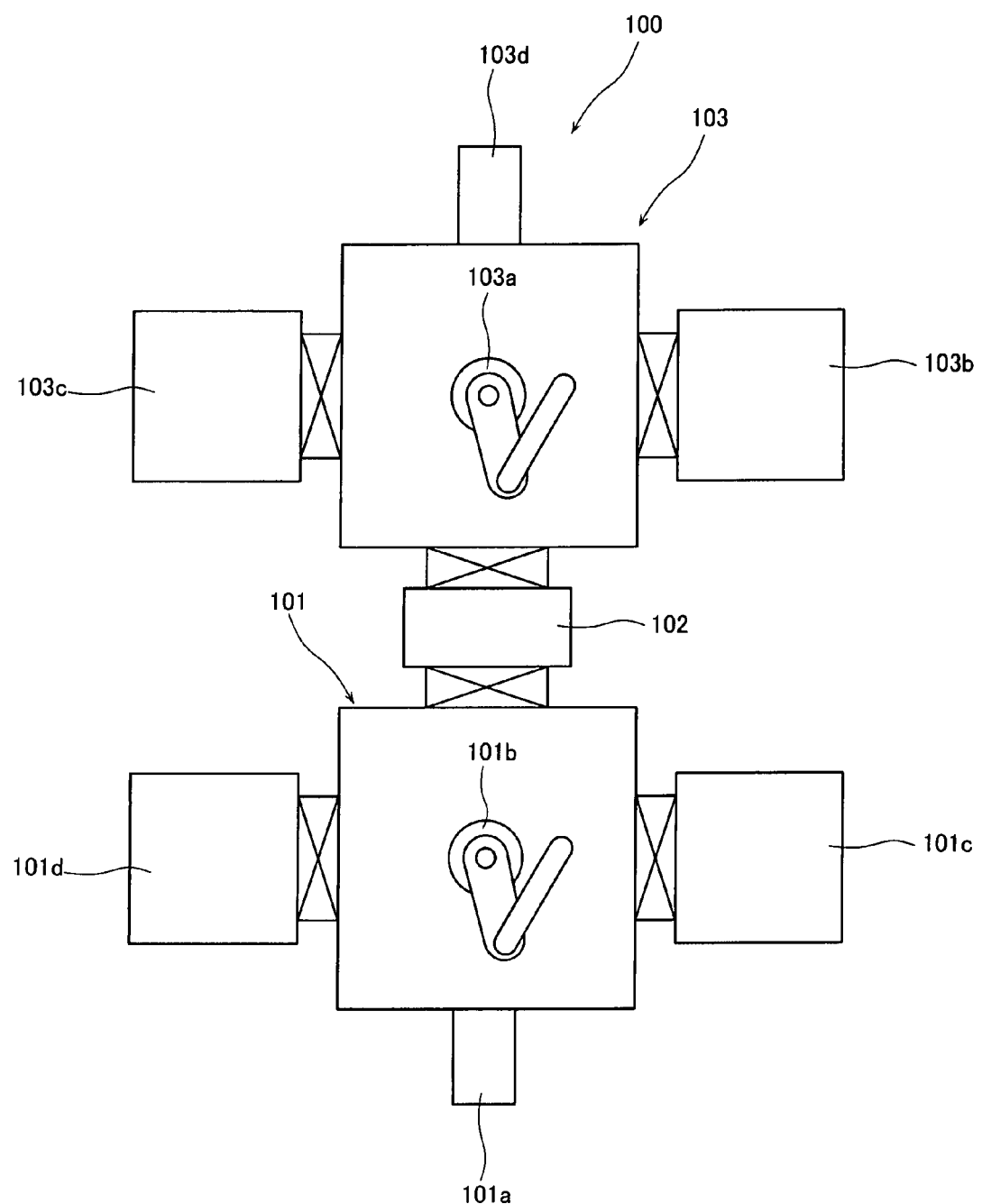
FIG. 6 is a schematic block diagram for illustrating a composite type electrical connection film-forming apparatus provided with a film-forming apparatus, incorporated into the same, used for carrying out the film-forming method according to the present invention.
Figure 7:
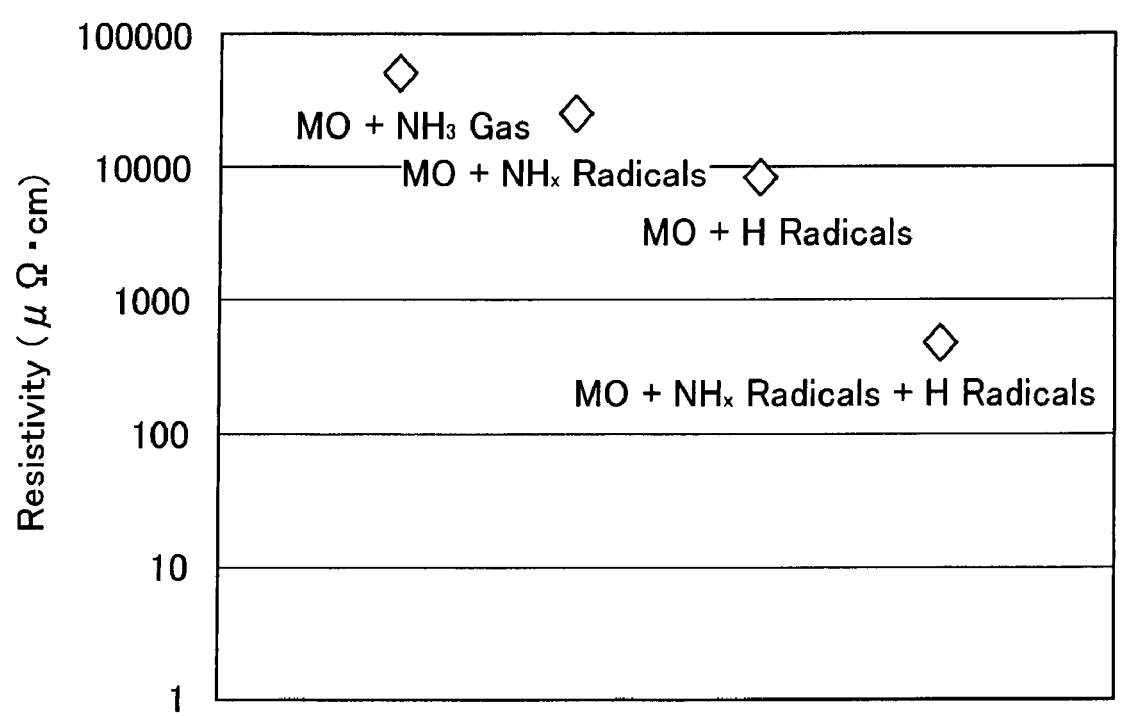
FIG. 7 is a graph on which the resistivity $\rho$ ($\mu\Omega \cdot cm$) observed for each thin film prepared in Example 1 is plotted.

1 . . . Film-forming apparatus; 11 . . . Vacuum chamber; 12 . . . Substrate; 13 . . . Substrate holder; 14 . . . Raw gas-introducing system; 15 . . . $NH_3$ gas or $NH_x$ radicals-introducing system; 16 . . . Reactant gas-introducing system; 17 . . . Vacuum evacuation system; 18 . . . Target; 19 . . . Voltage-applying device; 20 . . . Sputtering gas-introducing system; 121 . . . Adhesive layer on the substrate side; 122 . . . Barrier film; 123 . . . Adhesive layer on the electrical connection-forming film.

What is claimed is:

1. A method for forming a tantalum nitride film comprising the steps of:
   introducing a raw gas consisting of a coordination compound constituted by an elemental tantalum (Ta) having a coordinated ligand represented by the general formula: N=(R, R') (in the formula, R and R' may be the same or different and each represents an alkyl group having 1 to 6 carbon atoms), and $NH_3$ gas or $NH_x$ radicals into a vacuum chamber;
   adsorbing the raw gas and $NH_3$ gas or $NH_x$ radicals on a substrate for the reduction of the raw compound on the substrate to form a surface adsorption film having a thickness corresponding to one or several atoms, which consists of the resulting reduced compound, and to partially remove the R(R') groups bonded to the N atoms present in the coordination compounds through the cleavage thereof;
   reacting the surface adsorption film containing the reduced compound with H radicals derived from an H atom-containing gas to break the Ta—N bonds and to break and remove the remaining R(R') groups bonded to the N atoms in the foregoing reduced compound; and
   alternately repeating the adsorption step and the reaction step to form a tantalum nitride film rich in tantalum atoms.

2. The method for forming a tantalum nitride film as set forth in claim 1, wherein it comprises the steps of first introducing the raw gas into the vacuum chamber to thus adsorb the raw gas on the substrate, and then introducing the $NH_3$ gas or $NH_x$ radicals into the vacuum chamber to thus make the same react with the adsorbed raw gas to reduce the raw gas and to thus form a surface adsorption film containing the resulting reduction compound and having a thickness corresponding to one or several atoms.

3. The method for forming a tantalum nitride film as set forth in claim 1, wherein it comprises the steps of first introducing the raw gas into the vacuum chamber to thus adsorb the raw gas on the substrate, and then simultaneously introducing the $NH_3$ gas or $NH_x$ radicals and the H radicals derived from the H atom-containing gas into the vacuum chamber to thus make them react with the adsorbed raw gas.

4. The method for forming a tantalum nitride film as set forth in claim 1, wherein the raw gas is the gas of at least one coordination compound selected from the group consisting of penta-dimethyl-amino-tantalum, tert-amylimido-tris(dimethylamide) tantalum, penta-diethyl-amino-tantalum, tert-butylimido-tris (dimethylamide) tantalum, tert-butyl-imido-tris(ethyl-methylamide) tantalum, and Ta(N Ta(N(CH$_2$)$_2$(N(CH$_2$CH$_3$)$_2$)$_2$.

5. The method for forming a tantalum nitride film as set forth in claim 1, wherein the NH$_x$ radicals are NH, NH$_2$, or NH$_3$ radical.

6. The method for forming a tantalum nitride film as set forth in claim 1, wherein the hydrogen atom-containing gas is at least one member or a gas selected from the group consisting of H$_2$, NH$_3$ and SiH$_4$ gases.

7. The method for forming a tantalum nitride film as set forth in claim 1, wherein the tantalum nitride film is one which satisfies the following requirement: the compositional ratio of tantalum to nitrogen: Ta/N$\geq$2.0.

8. A method for forming a tantalum nitride film comprising the steps of forming a tantalum nitride film according to the method as set forth in claim 1; and then implanting tantalum particles into the resulting tantalum nitride film according to the sputtering technique which makes use of a target containing tantalum as the principal constituent component.

9. The method for forming a tantalum nitride film as set forth in claim 8, wherein the following steps are alternately repeated over a plurality of times: the adsorption step and the reaction step and the step for implanting tantalum particles into the resulting tantalum nitride film according to the sputtering technique which makes use of a target containing tantalum as the principal constituent component.

10. The method for forming a tantalum nitride film as set forth in claim 8, wherein the step for implanting tantalum particles into the resulting tantalum nitride film according to the sputtering technique which makes use of a target containing tantalum as the principal constituent component is carried out during the implementation of the adsorption step and the reaction step.

11. The method for forming a tantalum nitride film as set forth in claim 8, wherein the sputtering step is carried out while controlling the DC power and the RF power in such a manner that the DC power is low and the RF power is high.

12. The method for forming a tantalum nitride film as set forth in claim 8, wherein the tantalum nitride film formed is one which satisfies the following requirement: the compositional ratio of tantalum to nitrogen: Ta/N$\geq$2.0.

13. A method for forming a tantalum nitride film comprising the steps of:
introducing a raw gas consisting of a coordination compound constituted by an elemental tantalum (Ta) having a coordinated ligand represented by the general formula: N=(R, R') (in the formula, R and R' may be the same or different and each represents an alkyl group having 1 to 6 carbon atoms) into a vacuum chamber;
adsorbing the raw gas on a substrate;
introducing H radicals derived from an H atom-containing gas into the vacuum chamber;
reacting the H radicals with the adsorbed raw gas; and
thereafter, introducing NH$_3$ gas or NH$_x$ radicals into the vacuum chamber, or
introducing the H radicals derived from the H atom-containing gas into the vacuum chamber;
adsorbing the H radicals on the substrate;
introducing the raw gas into the vacuum chamber;
reacting the raw gas with the adsorbed H radicals; and
thereafter, introducing the NH$_3$ gas or NH$_x$ radicals into the vacuum chamber.

\* \* \* \* \*